United States Patent
Käppeler et al.

(10) Patent No.: US 8,062,426 B2
(45) Date of Patent: Nov. 22, 2011

(54) CVD REACTOR WITH RF-HEATED PROCESS CHAMBER

(75) Inventors: Johannes Käppeler, Würselen (DE); Frank Wischmeyer, Melle (DE)

(73) Assignee: Aixtron Inc., Sunnyvale, CA (US)

( * ) Notice: Subject to any disclaimer, the term of this patent is extended or adjusted under 35 U.S.C. 154(b) by 1012 days.

(21) Appl. No.: 11/722,686

(22) PCT Filed: Dec. 12, 2005

(86) PCT No.: PCT/EP2005/056679
§ 371 (c)(1), (2), (4) Date: Jun. 22, 2007

(87) PCT Pub. No.: WO2006/069908
PCT Pub. Date: Jul. 6, 2006

(65) Prior Publication Data
US 2008/0092817 A1  Apr. 24, 2008

(30) Foreign Application Priority Data
Dec. 24, 2004 (DE) .......... 10 2004 062 553

(51) Int. Cl.
*C23C 16/00* (2006.01)

(52) U.S. Cl. .......... 118/725; 118/724

(58) Field of Classification Search .......... 118/725
See application file for complete search history.

(56) References Cited

U.S. PATENT DOCUMENTS

| | | | | |
|---|---|---|---|---|
| 4,579,080 A * | 4/1986 | Martin et al. | | 118/500 |
| 4,753,192 A * | 6/1988 | Goldsmith et al. | | 118/725 |
| 5,433,167 A | 7/1995 | Furukawa et al. | | |
| 5,879,462 A * | 3/1999 | Kordina et al. | | 118/725 |
| 6,039,812 A * | 3/2000 | Ellison et al. | | 118/725 |
| 6,299,683 B1 | 10/2001 | Rupp et al. | | |
| 2004/0007187 A1 * | 1/2004 | Kappeler et al. | | 118/730 |
| 2004/0020436 A1 * | 2/2004 | Kaeppeler et al. | | 118/724 |
| 2006/0118048 A1 * | 6/2006 | Maccalli et al. | | 118/728 |

FOREIGN PATENT DOCUMENTS

| | | |
|---|---|---|
| DE | 10055182 A1 | 5/2002 |
| WO | 00/43577 A | 7/2000 |
| WO | WO 0238838 A1 * | 5/2002 |
| WO | 2004/053187 A | 6/2004 |

OTHER PUBLICATIONS

Aixtron AG, PCT/EP2005/056679, International Search Report and Written Opinion, Feb. 20, 2006, 11pp, ISA/EP.

* cited by examiner

*Primary Examiner* — Ram Kackar
*Assistant Examiner* — Anna Crowell
(74) *Attorney, Agent, or Firm* — SNR Denton US LLP

(57) ABSTRACT

The invention concerns a deposition device in particular of crystalline coatings on at least one substrate in particular crystalline. Said device comprises a treatment chamber (5) consisting of a number of wall elements (1, 2, 3, 4), said wall elements (1, 2, 3, 4) being electroconductive and placed end-to-end, thus forming contacts (2', 2", 3', 3"); a reactor housing (6) enclosing the wall elements (1, 2, 3, 4) of the treatment chamber and made of a non-electroconductive material and a RF-heated coil surrounding the wall elements (1, 2, 3, 4) of the treatment chamber. The invention is characterized in that a massive single-piece shield heating pipe (8) is implanted between the reactor housing (6) and the walls (1, 2, 3, 4) of the treatment chamber. The material of said pipe is electroconductive so that it is heated by the eddy currents induced therein by the RF field generated by the RF coil and so that it absorbs considerably the RF field and heats the walls (1, 2, 3, 4) of the treatment chamber.

13 Claims, 5 Drawing Sheets

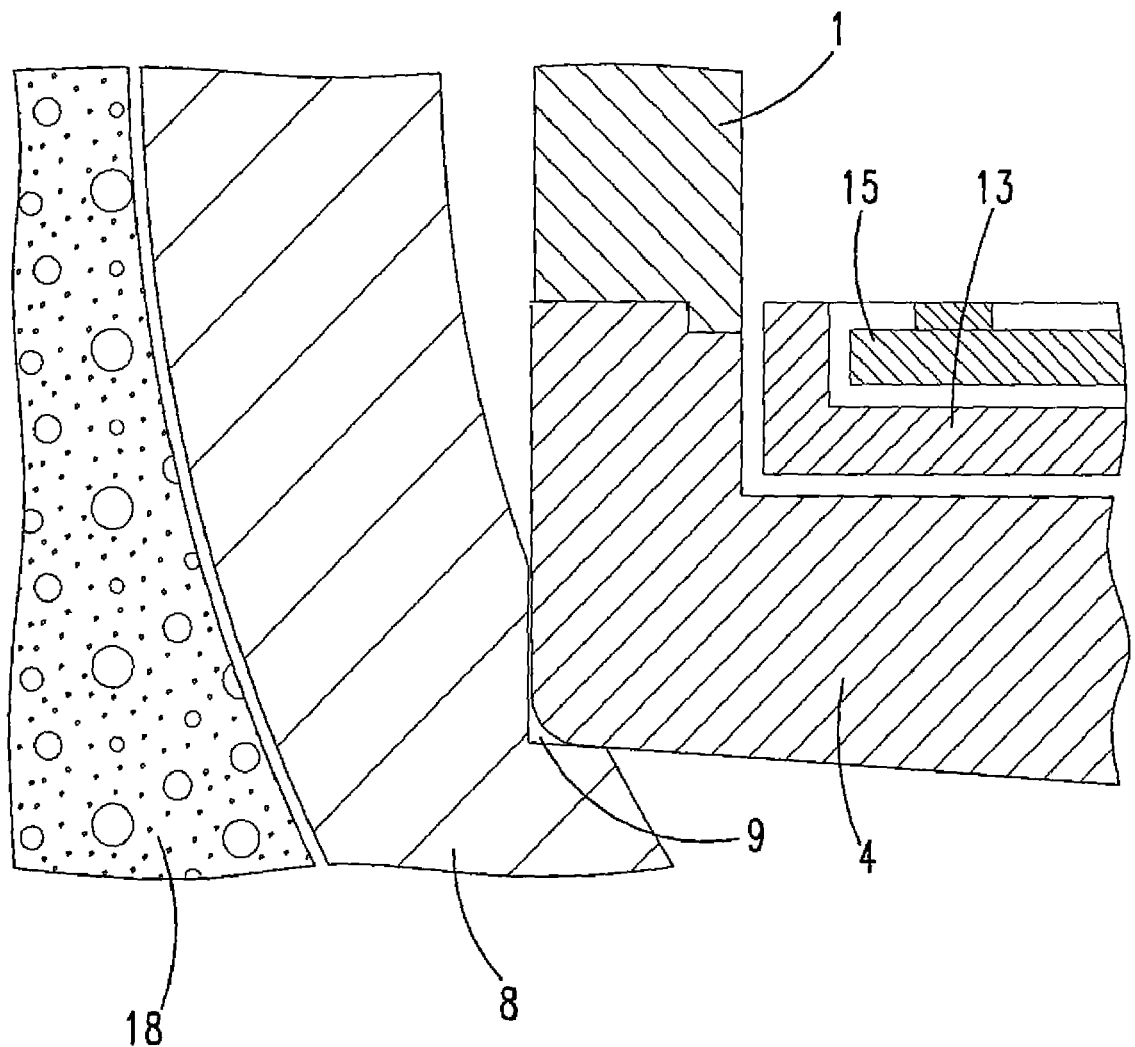

CVD REACTOR WITH RF-HEATED PROCESS CHAMBER

CROSS REFERENCES TO RELATED APPLICATIONS

The present patent application is a national phase application of International Application No. PCT/EP2005/056679 filed Dec. 12, 2005, which claims priority benefit from German Application 102004062553.0 filed Dec. 24, 2004, which is herein incorporated by reference.

FIELD OF THE INVENTION

The invention relates to a device for depositing layers, in particular crystalline layers, on at least one substrate, in particular a crystalline substrate, comprising a process chamber formed by a number of wall elements, which wall elements are electrically conductive and engage against one another forming touching contacts, comprising a reactor housing, accommodating the process chamber wall elements and consisting of electrically nonconductive material, and comprising an RF heating coil surrounding the process chamber wall elements.

BACKGROUND

Such a device is described by DE 10055182 A1. This device comprises a quartz tube within which a process chamber is located. The process chamber wall comprises a number of graphite elements, that is a top, two walls and a bottom. The individual graphite wall elements engage against one another in touching contact. The known device is surrounded by an RF coil, which generates an RF field inside the reactor housing. Said field produces eddy currents in the process chamber walls. As a result of the contact resistances in the regions where the individual wall elements engage against one another, instances of local heating or even spark discharges occur.

SUMMARY OF THE DESCRIPTION

It is an object of the invention to develop a generic device to the extent that the temperature profile within the process chamber is more homogeneous.

The object is achieved by the invention specified in the claims.

In principle, all the claims describe and claim independent solutions, even if they are formally worded as subclaims. The individual claims can be combined with one another in any desired form.

Claim 1 provides first and foremost a shielding/heating tube. This tube is to be disposed inside the reactor housing, but outside the process chamber, and be electrically conductive in such a manner that the RF field generated by the RF coil produces eddy currents there. These eddy currents are intended to heat the shielding/heating tube and at the same time dampen the field strength of the RF field in such a way that there is induced in the electrically conductive walls of the process chamber only a fraction of the eddy currents that apply in the prior art, so that the heating takes place substantially in the material of the shielding/heating tube. This has the consequence that the instances of local heating observed in the prior art in the region of the contact zones of the individual process chamber wall elements are prevented. As a consequence of this, a homogenized temperature profile is obtained inside the process chamber of the hot-wall reactor.

In a development of the invention, it is provided that the shielding/heating tube consists of graphite. It comprises a single part and is solid. The tube can be produced for example by boring out a solid material part that has previously been turned on a lathe to obtain a cylindrical form. The wall thickness of the shielding/heating tube is chosen such that the required shielding effect occurs. Furthermore, the inner wall of the shielding/heating tube preferably has a profiling, by means of which the process chamber can be held within the shielding/heating tube. This holding means may take the form of either notch cut-outs or projections which protrude radially inward from the inner wall of the shielding/heating tube. Above the top of the process chamber and below the bottom of the process chamber there is respectively a cavity between the process chamber wall on the one hand and the shielding/heating tube on the other hand. This cavity may be used for cooling the entire device when the chemical depositing process has been completed. The cooling may be effected for example by introducing a cold gas. However, it is also allowed for that solid bodies with suitable cooling fluids are introduced into these cavities for cooling. In a development of the invention, it is provided that the bottom of the process chamber has a removable loading plate, which carries a substrate holder on which the substrate to be coated rests. With regard to the configuration of such a loading plate, reference is made to DE 10055182 A1, the disclosure content of which is fully incorporated in the present application. For instance, it is provided in particular that in the bottom of the process chamber wall there runs a flow channel through which there is introduced a carrier gas, which exits in outlet nozzles underneath the substrate holder, in order to produce a rotating gas cushion for the substrate holder.

BRIEF DESCRIPTION OF THE DRAWINGS

Exemplary embodiments of the invention are explained below on the basis of accompanying drawings, in which:

FIG. 5 shows a detail according to cutout V in FIG. 4.

DETAILED DESCRIPTION

Figure 1:
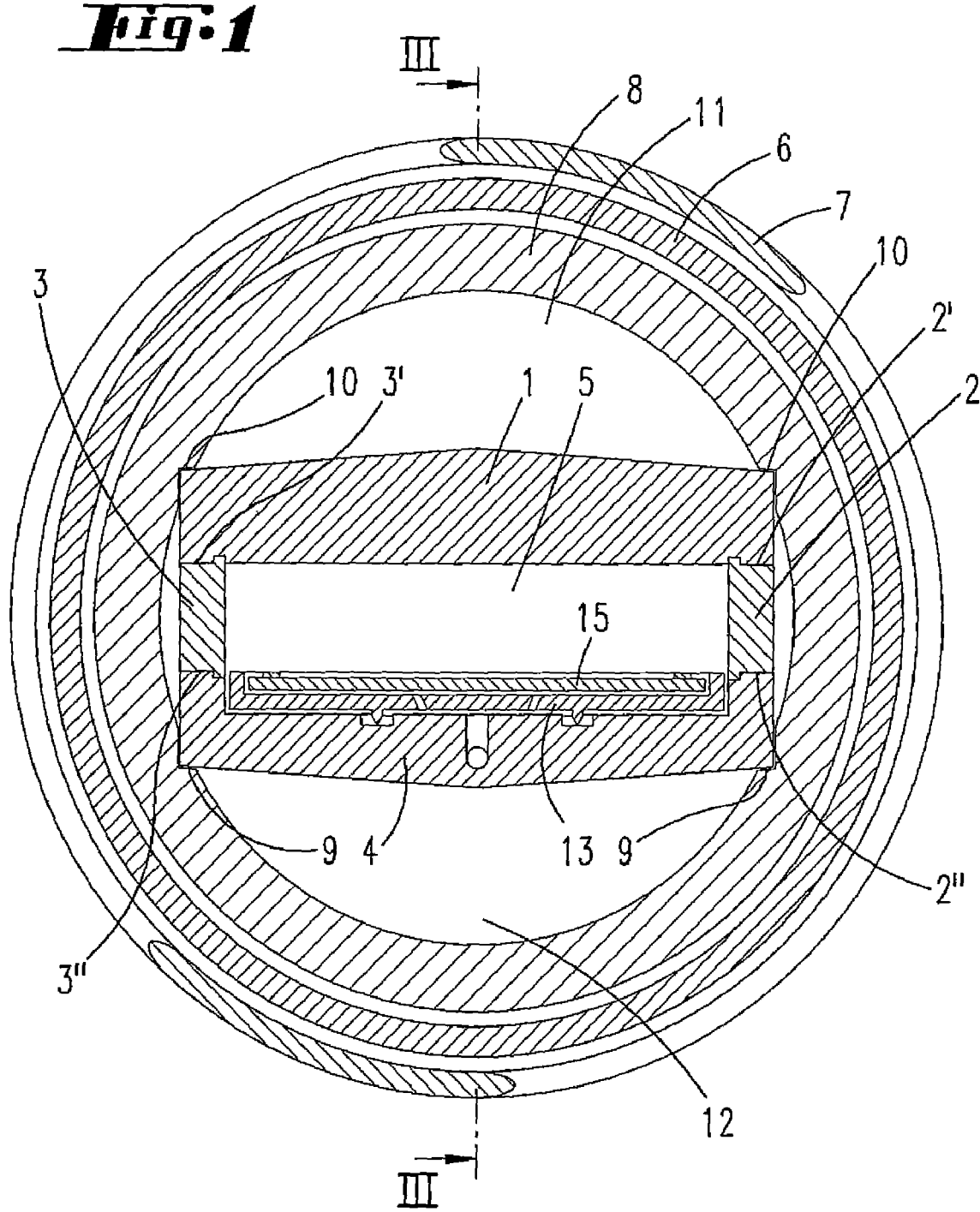
FIG. 1 shows the cross-section through a reactor housing of a first exemplary embodiment.

The devices described in the exemplary embodiments are CVD reactors, which have a process chamber 5, inside which a deposition process takes place. These are CVD reactors for depositing in particular III-V or II-VI semiconductor layers on III-V or II-VI substrates. The reactive gases are introduced into the process chamber 5, which is heated on all sides, through a gas inlet 14. The reactive gases are preferably metal chlorides, for example gallium chloride or indium chloride, or hydrides, for example arsine or phosphine. As a result of a pyrolytic decomposition inside the process chamber 5, a crystalline layer is deposited on the substrate. In addition, suitable carrier gases such as hydrogen or nitrogen are introduced into the process chamber.

A special gas supply line 16 is provided, through which the carrier gas, for example hydrogen, is introduced into the bottom 4 of the process chamber. This gas supply line 16 opens out in the bottom of a step on which there is a loading plate 13. The mouth of the gas supply line 16 is surrounded by an annular groove, into which there protrudes an annular seal as a projection on the bottom of the loading plate 13. From the annular chamber produced as a result, the gas flowing in there through the gas supply line 16 can pass through thin gas lines into a recess in the loading plate 13, in which a substrate holder 15 lies. The substrate holder 15 is circular and carries a substrate. The gas introduced under the substrate holder 15 effects a rotation and lifting of the substrate holder 15, so that it hovers on a gas cushion.

The loading plate 13 can be removed from the process chamber 5 by suitable handling equipment. Details of this are described in DE 10055182 A1.

The wall of the reaction chamber is formed by a quartz tube 6. This is closed in the region of the gas inlet 14 by a closure plate 17. A similar closure plate (not represented) is provided on the gas outlet side.

An RF coil is wound around the quartz tube 6. This coil comprises a multiplicity of turns, which lie axially one behind the other, so that an axial portion of the process chamber lies in the region of the radio-frequency field generated by the RF coil 7.

Inside the quartz tube 6, a graphite tube 8 extends over virtually the entire length of the RF coil 7. This graphite tube 8 forms a shielding/heating tube. In it, the RF field of the RF coil produces eddy currents, so that the graphite tube 8 is heated up. The graphite tube 8 additionally effects a damping of the RF field in such a way that only small eddy currents are induced in the process chamber wall elements 1, 2, 3, 4, so that the process chamber as a whole is heated up substantially by thermal radiation, the radiant heat coming from the shielding/heating tube.

The process chamber 5 is surrounded by an upper top 1 and a lower bottom 4. On the peripheral portions of the bottom 4 there are side elements 2, 3, which are positively connected to the bottom 4 and the top 1 of the process chamber respectively. Tongues of the sides 2, 3 engage in corresponding grooves of the top 1 and the bottom 4 of the process chamber. These regions form contact zones 2', 2", 3' and 3".

In the case of the exemplary embodiment represented in FIG. 1, the process chamber has a rectangular form, its width being considerably greater than its height. The corner regions of the bottom 4 lie in corner recesses 9 of the inner wall of the shielding/heating tube 8. Opposite these corner recesses 9 are further corner recesses 10, which enclose the corners of the top 1 of the process chamber. The process chamber elements 1, 2, 3, 4 lie in the corner recesses 9, 10 with adequate play for thermal expansion to be possible.

Figure 2:
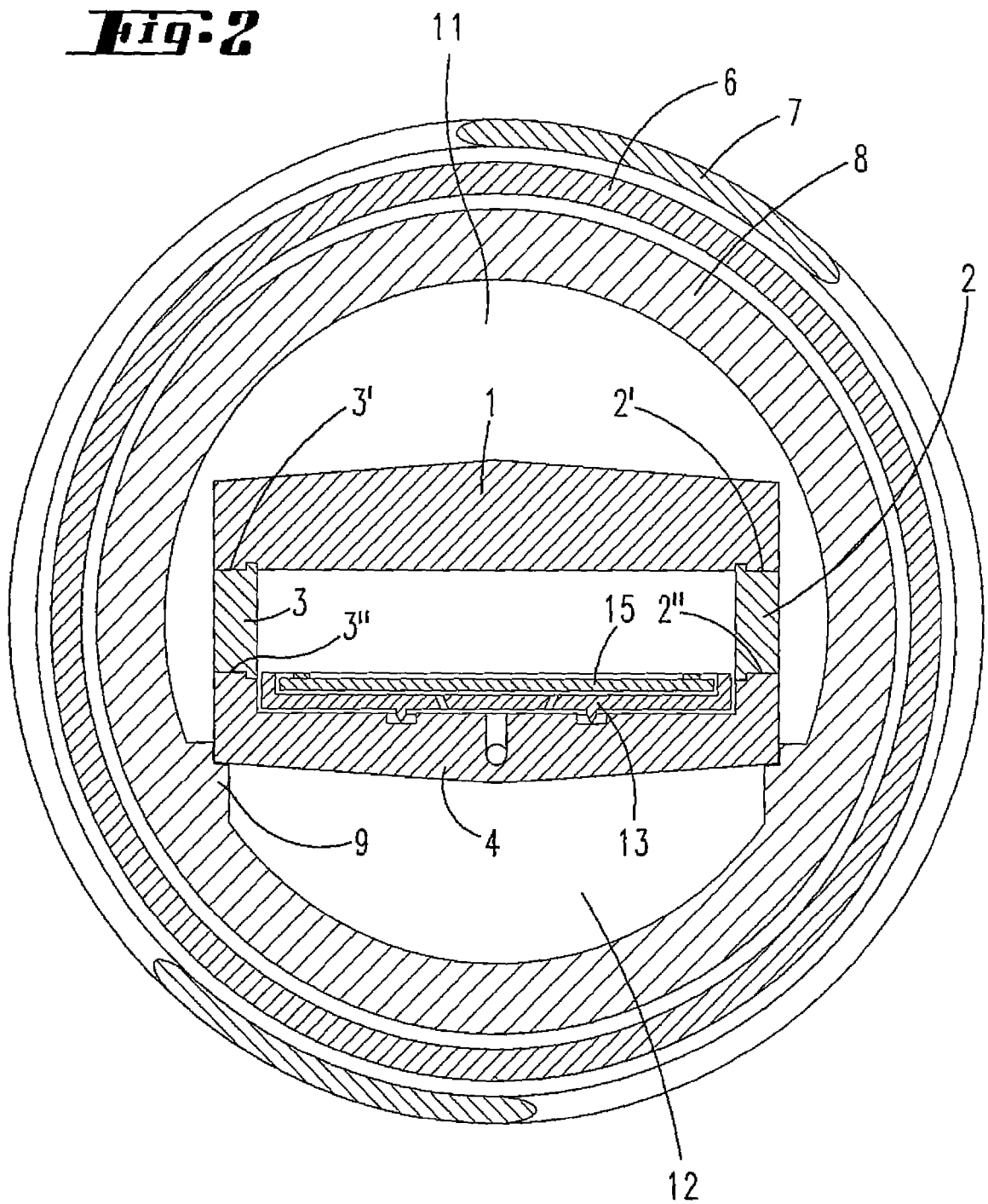
FIG. 2 shows the cross-section through a reactor housing of a second exemplary embodiment.
Figure 3:
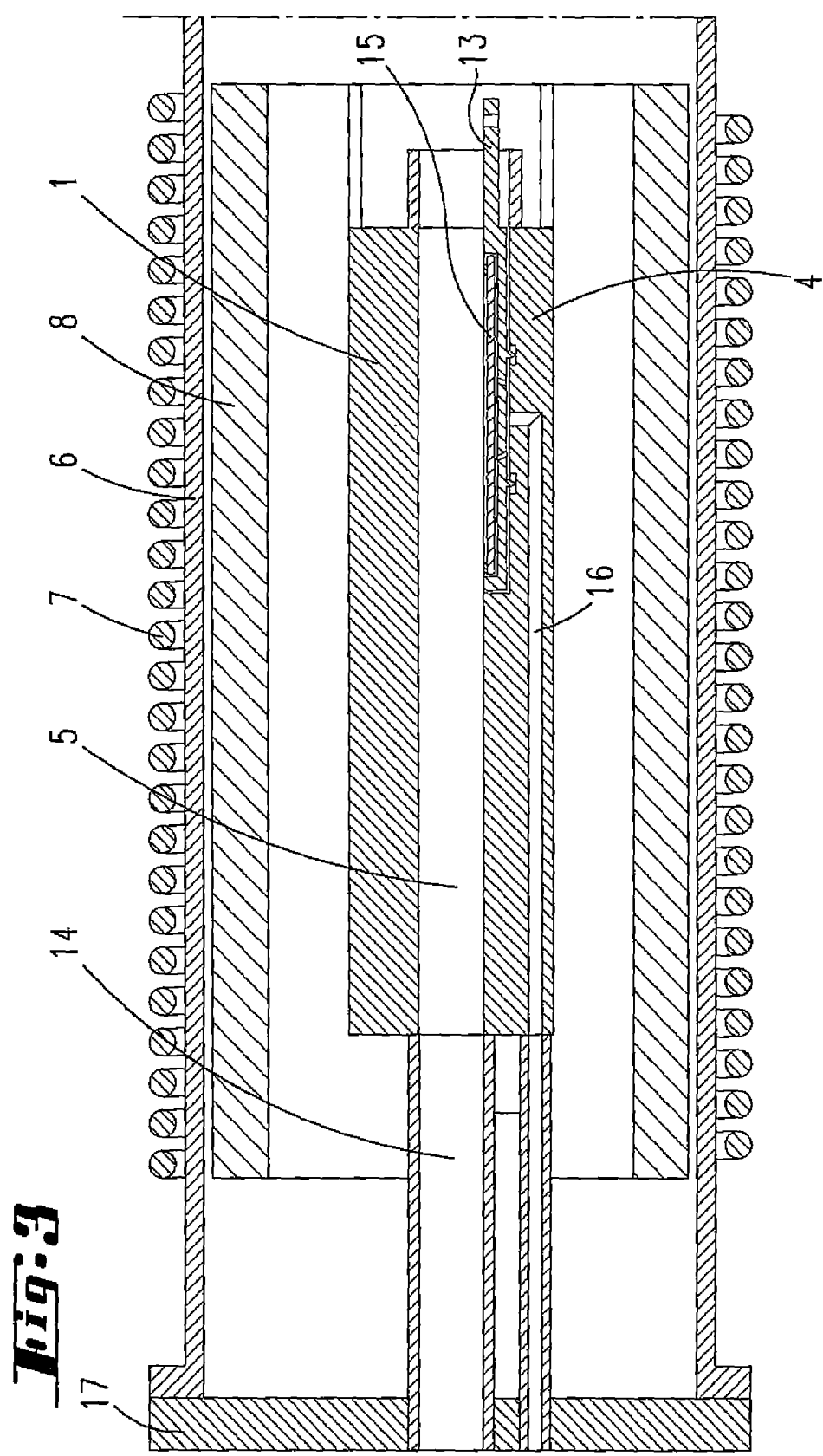
FIG. 3 shows a section along the line III-III in FIG. 1.

In the case of the exemplary embodiment represented in FIG. 2, projections 9 protrude from the inner wall of the shielding/heating tube 8 and likewise form corner recesses in which the corner regions of the bottom 4 of the process chamber lie.

An important factor is the radial thickness of the shielding/heating tube consisting of graphite, in combination with its electrical conductivity. This must be great enough to achieve adequate damping to ensure that no high voltages that could lead to instances of local heating are produced in the contact zones 2', 2", 3', 3".

Also of advantage are the two diametrically opposite hollows 11, 12, which are disposed underneath the bottom 4 and above the top 1 of the process chamber respectively. These hollows 11, 12 may be used for the purpose of introducing cooling bodies in the cooling phase. These hollow spaces may also be flowed through by other types of cooling media. In the simplest case, cooling rods that are not represented in the drawings may be introduced there from the gas outlet side or the gas inlet side. These cooling rods may be water-cooled, in order to carry the heat away from the reactor quickly.

Figure 4:
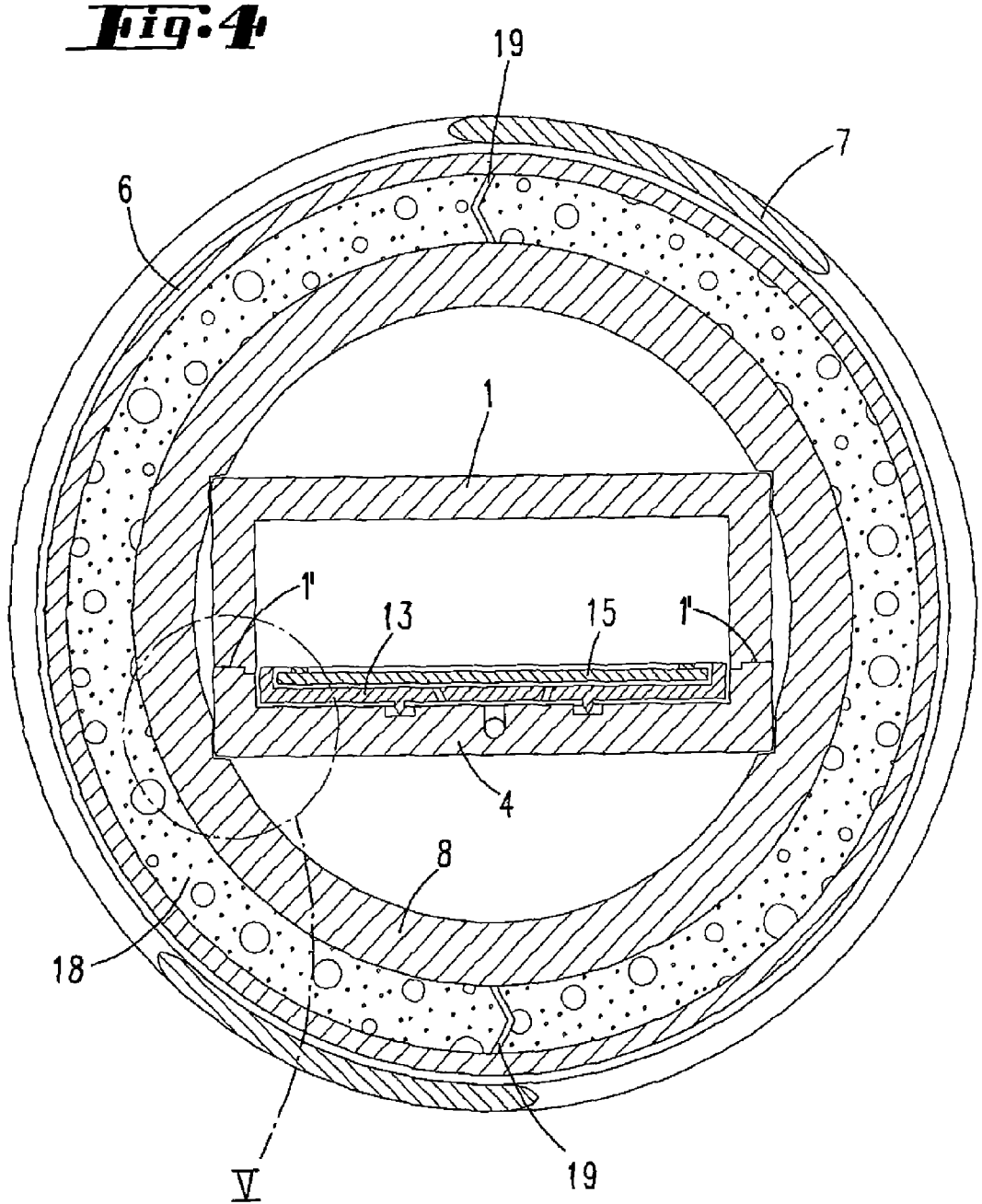
FIG. 4 shows a further exemplary embodiment of the invention in a representation according to FIG. 1.

In the case of the exemplary embodiment represented in FIGS. 4 and 5, the shielding/heating tube 8 is produced from graphite and has on the inner wall side angular flutes 9, which receive the lower peripheral edges of the bottom 4 of the process chamber. The process chamber is formed in two parts here. The profiled legs 1' of a U-shaped top part 1 consisting of graphite rest on the peripheries of the bottom 4.

The shielding/heating tube 8 is surrounded by a graphite foam 18. This has two diametrically opposite angular expansion gaps 19. The graphite foam body 18, consisting of two half-shells, holds the shielding/heating tube 8 in a coaxial position in relation to the reactor housing tube 6, consisting of quartz. With respect to the configuration of the graphite foam, reference is made to DE 10055182 A1.

All disclosed features are (in themselves) pertinent to the invention. The disclosure content of the associated/accompanying priority documents (copy of the prior patent application) is also hereby incorporated in full in the disclosure of the application, including for the purpose of incorporating features of these documents in claims of the present application.

What is claimed:

1. A device for depositing crystalline layers on at least one crystalline substrate, comprising:
    a process chamber (5) formed by a number of wall elements (1, 2, 3, 4), which wall elements (1, 2, 3, 4) are electrically conductive and engage against one another, with touching contacts (2', 2", 3', 3") being formed;
    a reactor housing (6), accommodating the process chamber wall elements (1, 2, 3, 4) and consisting of an electrically nonconductive material;
    an RF heating coil (7) surrounding the process chamber wall elements (1, 2, 3, 4); and
    a one-piece, solid shielding/heating tube (8), which is disposed between the reactor housing (6) and the process chamber wall elements (1, 2, 3, 4), the material of the shielding/heating tube (8) consisting of graphite and being electrically conductive in such a way that the shielding/heating tube (8) is heated by eddy currents induced by an RF field generated by the RF heating coil (7) and dampens the RF field to a considerable extent, the shielding/heating tube (8) surrounding the process chamber wall elements (1, 2, 3, 4) in such a way that the process chamber wall elements (1, 2, 3, 4) are primarily heated up by thermal radiation from the shielding/heating tube (8).

2. The device as claimed in claim 1, characterized in that the process chamber wall elements (1, 2, 3, 4) comprise at least two parts that can be separated from each other.

3. The device as claimed in claim 1, characterized in that the process chamber wall elements (1, 2, 3, 4) are held in the reactor housing (6) by the shielding/heating tube (8).

4. The device as claimed in claim 1, characterized by holding means (9, 10) of the shielding/heating tube (8) that act in corner regions of the process chamber wall elements (1, 2, 3, 4).

5. The device as claimed in claim 4, characterized in that the holding means (9, 10) are recesses or projections on an inner wall of the shielding/heating tube (8).

6. The device as claimed in claim 1, characterized by hollows (11, 12) disposed between the process chamber wall elements (1, 2, 3, 4) and the shielding/heating tube (8).

7. The device as claimed in claim 6, characterized by cooling elements that can be introduced into the hollows (11, 12).

8. The device as claimed in claim 1, further including a loading plate (13), which is associated with a bottom one of the wall elements of the process chamber and is intended for receiving a substrate.

9. The device as claimed in claim 8, characterized in that the loading plate (13), which can be introduced into the process chamber and removed from it by a handling device or the like, carries a substrate holder (15).

10. device as claimed in claim 9, characterized in that the substrate holder (15) is configured to be rotationally driven on a gas cushion.

11. The device as claimed in claim 10, further including a gas supply line which is associated with the bottom (4) one of the process chamber wall elements and opens out in a step in a region of the bottom, which step accommodates the loading plate (13), which has on its underside sealing means to seal a gas outlet opening of the gas supply line (16) in such a way that a gas stream emerging from it can pass through admission passages in the loading plate, in order to rotationally drive a circular disk-shaped plate that lies in a recess in the loading plate (13) and holds the substrate holder.

12. The device as claimed in claim 1, characterized by a CVD process carried out in the process chamber, in particular elements of the IIIrd and Vth or IInd and VIth main group being deposited in a crystal-forming manner.

13. The device as claimed in claim 12, characterized in that elements of the IIIrd main group are supplied as chlorides and the elements of the Vth main group are supplied as hydrides.

* * * * *